United States Patent [19]

Sullivan

[11] Patent Number: 4,528,259
[45] Date of Patent: * Jul. 9, 1985

[54] PRINTED WIRING BOARDS WITH SOLDER MASK OVER BARE COPPER WIRES HAVING LARGE AREA THICKENED CIRCUIT PAD CONNECTIONS

[76] Inventor: Donald F. Sullivan, 115 Cambridge Rd., King of Prussia, Pa. 19406

[*] Notice: The portion of the term of this patent subsequent to Mar. 19, 2002 has been disclaimed.

[21] Appl. No.: 550,379

[22] Filed: Nov. 10, 1983

[51] Int. Cl.³ .......................... G03C 5/00; G03F 7/26
[52] U.S. Cl. .................... 430/312; 430/313; 430/315; 430/319; 204/15
[58] Field of Search .............. 430/312, 313, 314, 315, 430/316, 318, 319, 271, 273, 329; 204/15

[56] References Cited

U.S. PATENT DOCUMENTS

| | | | |
|---|---|---|---|
| 4,054,483 | 10/1977 | Peiffer | 156/632 |
| 4,260,675 | 4/1981 | Sullivan | 430/315 |
| 4,424,089 | 1/1984 | Sullivan | 156/155 |
| 4,436,806 | 3/1984 | Rendulic et al. | 430/311 |

Primary Examiner—John E. Kittle
Assistant Examiner—José G. Dees
Attorney, Agent, or Firm—Laurence R. Brown

[57] ABSTRACT

In a printed wiring board of the type that places a solder mask over bare copper circuit traces, the solder mask is laid down with a flat planar surface by means of a liquid photopolymer solder mask layer deposited, photoexposed and developed to uncover those circuit trace positions such as through holes and connector pads for further processing. Then a very thin copper layer is chemically deposited over the surface area and a resist layer is laid down as a cover insulating layer on the flat surface so that a thicker layer of copper may be electrolytically plated over the uncovered circuit traces. In this manner the conductive area about each of the connector pads is significantly increased by plating on the sidewalls of the solder mask layer which surround the connector pads. Additionally the photopolymer flat surface is glossy and does not strongly adhere to the deposited thin copper layer as does the sidewall and conductor pad areas, thereby permitting the cover insulating layer and the thin copper layer to be readily removed from the flat planar surface by mechanical methods.

6 Claims, 3 Drawing Figures

PRINTED WIRING BOARDS WITH SOLDER MASK OVER BARE COPPER WIRES HAVING LARGE AREA THICKENED CIRCUIT PAD CONNECTIONS

TECHNICAL FIELD

This invention relates to printed wiring boards of the type having a solder mask layer over bare copper wiring etched on a substrate, and more particularly it relates to the preparation of connection sites at circuit pad and through hole positions which have thicker copper conductors and solder overlays.

BACKGROUND ART

To reduce the cost of printed wiring board manufacture, a solder mask layer has been placed directly over bare copper wire traces etched on a copper clad substrate. Connections are made to the wire traces, at circuit pad connector positions commonly called lands, by exposing the copper, that is by leaving voids in the solder mask so that the connection areas or circuit pads including those at through hole positions are not covered. The circuit pads are then covered with solder.

The copper cladding on the substrate is about 0.0014 in. (0035 cm) thick to facilitate etching of the circuit traces. Before etching the copper traces are electroplated to full thickness of about 0.002 in. (0.05 cm) before applying the solder mask. Also it is conventional to selectively plate the circuit pad positions with tin-lead or other protective layers before applying the solder mask layer and before etching. This requires a step of stripping the tin-lead layer in a chemical process which is difficult to protect against pollution.

The prior art process also limits the wiring density, since the land areas need to be in the order of 0.050 in. (0.13 cm) in diameter in order to make a reliable connection. Thus a closer together spacing of circuit traces is not feasible.

It is therefore an object of this invention to correct the foregoing deficiencies of the prior art. Further objectives are to reduce pollution in the manufacturing process, to increase wiring density, to reduce the amount of copper on the circuit boards, and to decrease the number of manufacturing steps and therefore the cost of production of printed circuit boards.

DISCLOSURE OF THE INVENTION

A wiring board clad with a thin copper coating is etched to provide a wiring trace pattern complete with circuit pad connection positions and through holes. The wiring density may be increased by making the circuit pad areas smaller than heretofore required. A liquid photopolymer solder mask layer is then placed over the wiring pattern to have a flat planar (flush) outer surface with a glossy surface to which a copper layer will not adhere well. This layer is then photo exposed and developed to uncover the land areas to which connections should be made. An electroless chemical deposit of a very thin copper layer is then deposited over the entire surface area. It will not adhere well to the glossy flat surface but does adhere well to the circuit copper wiring and the photo developed areas about the pad position and in particular on the sidewalls of the solder mask layer.

Then an insulating resist layer is laid over the deposited copper layer on the flat planar surface leaving exposed the circuit pad positions and the surrounding wiring board substrate area as well as the sidewalls of the solder mask coating, all covered with the deposited copper layer. A thicker coating of copper is then electroplated over only the exposed areas, and if desired a tin-lead coating. The resist layer together with the poorly adhering deposited copper layer is then mechanically stripped from the flat planar surface, such as by stripping, air or water abrasion.

THE PREFERRED EMBODIMENTS

Figure 3:
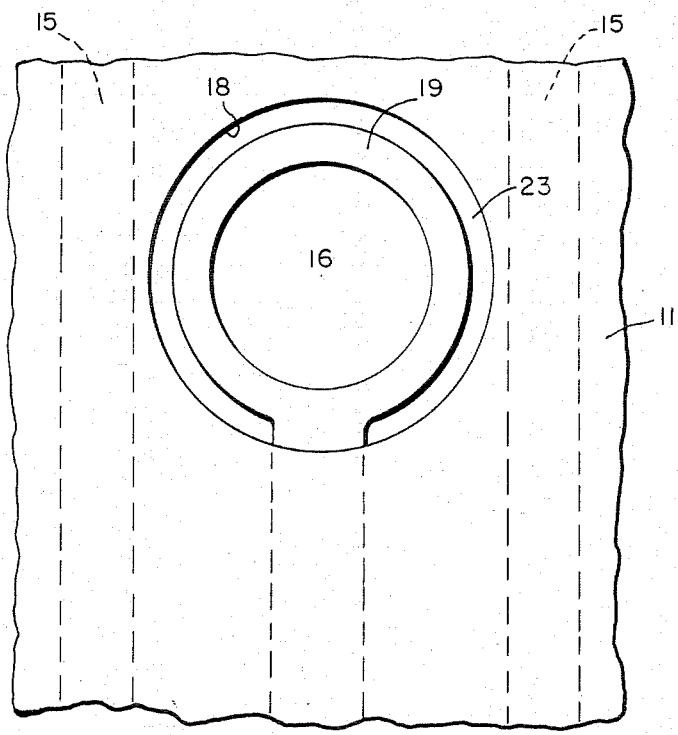
FIG. 3 is a plan view of a portion of the printed wiring board of FIG. 2 looking down at a through hole position.

The printed wiring board configuration shown in the drawings depicts a solder mask layer 11 over bare copper wiring traces 15 etched in a very thin copper cladding layer on the surface of the insulating substrate board 10. It is critical in connection land areas or circuit pads 14 such as shown about the through hole 16 that a minimum surface area be covered with a thick copper conductor, which may be soldered. In FIG. 3 it may be seen that the diameter of the eyelet 19 will dictate the spacing between circuit traces 15. It is thus inconsistent to expect higher wiring packing densities with wiring traces located closely together when circuit pads are reliably prepared with adequate conductor surface area.

Figure 1:
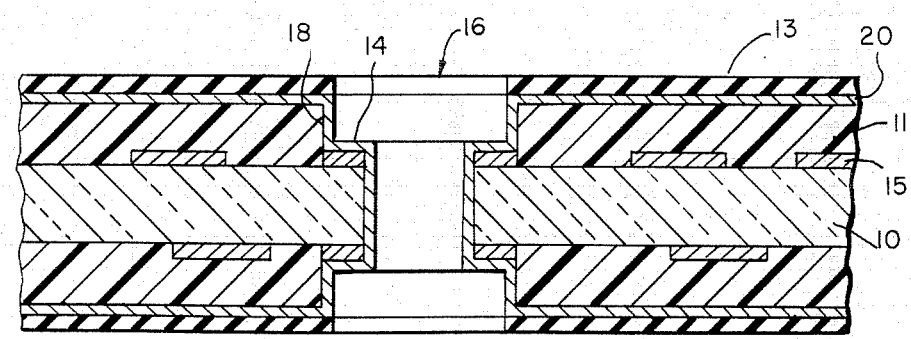
FIG. 1 is an elevation section view of a portion of a printed wiring board illustrating a step in the formation of a circuit connecting terminal at a through hole position.
Figure 2:
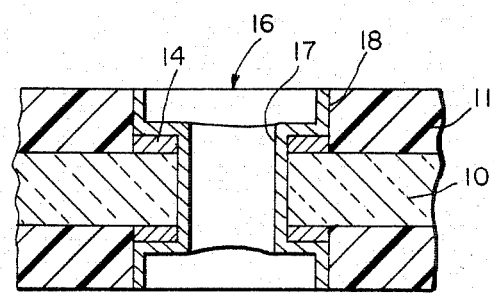
FIG. 2 is a similar elevation section view of the printed wiring board portion after completion of the process.

Also it may be noted from FIG. 2 that the lands 14 are covered with a thickening layer 17 of copper, but that circuit traces 15 do not have the thickening layer 17. Heretofore the processes of wiring board construction have included a thickening layer of copper on all the circuit wiring traces on the substrate 10 before the solder mask layer 11 is applied.

Now in accordance with this invention an improved wiring board is provided with more dense wiring, less copper and high quality large area circuit pad connections, surprisingly requiring fewer manufacturing steps. It is possible with the process of this invention to eliminate some critical chemical manufacturing steps before required to the effect that expensive pollution control procedures are no longer necessary.

Those steps taken in sequence to make this improved wiring board are outlined as follows:

1. drill the through holes 16 in the substrate laminate 10, which is clad with a very thin layer of copper to facilitate the etching of the circuit traces therein;

2. laying down an etch resist layer on the copper cladding to define the desired circuit trace pattern, etching away unwanted copper and stripping the etch resist layer;

3. laying down a liquid photopolymer solder mask layer with a smooth flat planar outer surface over the etched circuit traces, photoexposing to provide a pattern for leaving exposed land areas 14, etc. to be prepared as circuit connection pads, and developing to remove the photopolymer about the circuit lands 14, etc. in such a way to leave substantially cylindrical shaped solder mask walls with a somewhat roughened texture to which a layer of copper will adhere well;

4. chemically depositing by the electroless process a thin layer of copper, typically 0.00005 in (0.00013 cm) thick, over the solder mask surface and into the exposed land positions and on the substrate therearound and through the holes in the laminate;

5. rolling or screening over the electroless copper layer resident on the flat planar glossy solder mask outer surface an insulating resist layer 13;

6. electroplating a thick layer, typically 0.001 inch (0.25 cm), of copper 17; and 7. mechanically removing the resist layer 13 with the underlying thin copper layer 20 from the glossy surface of the solder mask layer 11 by stripping, air or water jet, etc.

The preferred liquid photopolymer for the solder mask coating is type 311LV manufactured by M & T Chemicals of Rahway, N.J. The coating thickness is at least 0.002 inch (0.005 cm) over traces and 0.004 inch (0.01 cm) over the base laminate. A preferred method of processing the solder mask layer is to deposit it in two separate coatings. The first coating can be screen printed with an appropriate gauge mesh polyester screen to a thickness of 0.002 inch (0.005 cm) directly over the substrate 10 with the wire traces 15 thereon. A further layer of the same thickness is coated on a flat photoimage plate of glass or plastic carrying an appropriate image for the soldermask pattern over the circuit traces. The two liquid photopolymer coatings are then brought together in air free contact so that the flat plate will further enhance the glossy outer surface to make a poor adherance surface for the electroless thin copper layer to be deposited thereon. This can be done by placing the layers in a vacuum chamber at decreased pressure of 25 inches (62.5 cm) of mercury thereby to purge all air from between the two coated surfaces before they are joined. Alternatively, where a thin layer of photopolymer can be used, as would be the case with thin copper conductors, then the liquid photopolymer can be applied to either the substrate 10 or the flat photoimage plate, but not necessarily both. The photo exposure step may take place either within or outside the vacuum chamber. The exposed photopolymer is developed by washing out unhardened areas with a solvent mixture of 85 parts trichloroethane and 15 parts isopropyl alcohol.

Metallization layer 20 is applied over the photopolymer surface after development using the M & T HD high speed autocatalytic copper plating process of M & T Chemicals. The deposition thickness is just enough to provide a conductive path for the electroplating step.

Plating resist layer 13 may be roller coated because the solder mask surface is flat and free of any projections or irregularities. A preferable resist is type CNF 1110 from M & T Chemicals.

Copper is conventionally electroplated on the exposed land areas to a thickness of the order of 0.001 inch (0.0025 cm). Note that this invention now provides for the plating of the substantially cylindrical side walls of the solder mask layer 11 thereby to substantially increase the available conductor area to which contact can be made. This permits the diameter of the eyelet 19 (FIG. 3) to be made smaller without reducing the reliability of the circuit pad connection.

Tin-lead is then electroplated over the thickened copper coating, after which the plating resist layer 13 is removed along with the underlying electroless deposited thin copper layer. Because of the glossy polymer surface the resist may be removed mechanically to avoid chemical processes and their corresponding pollutant atmospheres which must be confined or eliminated. Preferably this is done by air abrasion or by light sanding. It may also be done by an air or water stream. The electroless deposit about the land areas and through holes however makes a strong bond because the solder mask and substrate surfaces are textured by the earlier process steps. Thus the desired metallized areas are not removed by this mechanical removal step.

The typical increase in land surface area as illustrated in FIG. 3 has a typical 0.050 inch (0.125 cm) diameter eyelet 19 surface area increased at least 20 percent by metallizing the surrounding annular ring 23. In addition the metallization of the vertical wall surfaces of the solder mask layer, the land surface area is increased by 130 percent.

This process afforded by this invention thus eliminates several steps and reduces the expenditure of materials, while retaining the significant advantages of the solder mask over the bare wire type of printed wiring board. Accordingly, the conventional practice of plating tin-lead over all conductor traces before applying the solder mask coating is eliminated, together with the requisite chemical etcing and stripping and it polluting side effects. Furthermore immersion in molten solder with corresponding expensive equipment and hot air knives for blowing away excess solder are eliminated.

Additional advantages are provided by saving of materials where copper and tin-lead coatings are only required on the desired circuit pad locations. Fusing of the tin-lead layer is simply achieved with inexpensive equipment.

The ability to resolve fine lines and spaces is of great importance. One of the limitations to achieving fine lines and spaces of the order of 0.005 inch (0.0127 cm) is the primary imaging step, which is the photopatterning of either a plating or etch resist. An etch resist photopolymer is typically one fourth of the thickness of a plating resist photopolymer, and since the resolution decreases with the photopolymer thickness, greater resolution can be achieved with an etch resist pattern. The disclosed process defines conductor patterns by etching prior to electroplating and thereby achieves improved resolution. This departs from the prior art practice for soldermask on bare copper printed wiring boards where resolution is sacrificed by employment of a plating resist for the primary imaging.

For the higher resolution advantage afforded by this invention, the primary imaging of the conductor patterns is achieved by the steps now described. A flat (preferably glass) plate phototool with clear areas defining the conductor locations has a photopolymer release coating on the image plane over which a layer of the CNF 1110 photoresist is applied by screen printing over the entire plate surface.

The photopolymer layer is partially hardened in light struck areas by passing light through the glass plate into the photoresist layer. This step hardens the photopolymer layer enough so that its viscosity precludes extrusion of photopolymer from between the phototool and the printed wiring board. Next the glass plate is placed with the photopolymer layer near to and out of contact with the copper clad and previously drilled printed wiring board substrate, in a vacuum chamber for contact to be made in the presence of a pressure of about 30 inches (75 cm) of mercury.

Then the photopolymer is fully hardened by exposure to light passing through the glass plate and thereby clings to the printed wiring board. The release layer of the glass plate permits its removal for recoating and reuse with screening directly over the unhardened photoresist thereon.

Mentioned heretofore was the achievement of increased land surface area. One additional desirable feature of the lands is the increase in copper thickness on land areas, while the traces require no additional electroplated copper. Thus a heavy copper interconnection layer is provided without waste of copper.

New functions are achieved by this invention in addition to the traditional functions. The flush solder mask provides for restricting solder to land areas for wave soldering with life long insulation and environment protection. Furthermore the flush solder mask characteristic permits temporary metallization (from which used copper is reclaimable) mechanically removable with improved cost and environmental advantages.

Prior art solder mask coatings produce a surface which roughly follows the contours of the conductor patterns and is therefore not flush nor flat so that mechanical removal of a layer could not be achieved. If a solder mask is screen printed, mesh marks result and any metallization thereover would need be etched for removal. Smooth surfaced layers cannot be achieved by simply roller coating over a contoured surface, and the substitute photo imaging step would be more costly and time consuming.

A distinctive and novel feature of the printed wiring board afforded by this invention is the flat flush solder mask outer surface, which permits the electroless deposition step and corresponding simplification of the manufacturing process. Plating of the sidewalls of the solder mask layer is also a distinctive feature of this invention.

The disclosed method for solder masking or printed wiring boards is not restricted to solder mask over bare copper boards but can be used independently to achieve a solder mask coating over circuit traces covered with tin-lead or other metal.

This invention also provides for the inexpensive repair of faulty printed wiring boards having voids in the holes. These are conventionally scrapped. However the solder may now be stripped from the lands and through holes to expose the underlying copper. Next an etch resist is photoimaged to coat copper external surfaces, leaving through holes free of photoresist. The copper is removed from the holes by etching, so that a uniform coating of copper can be metallized therein. After etching, the plating resist is removed and the board is processed as previously described. Thus an expensive multilayer board can be restored at lower cost than remaking.

Having thus advanced the state of the art, those novel features believed descriptive of the nature and spirit of the invention are defined with particularity in the claims.

I claim:

1. The method of placing solder mask coating selectively in a pattern over conductor lands on printed circuit wiring boards comprising the steps of,
    coating the conductor lands on the printed wiring board with a layer of liquid photopolymer,
    coating a flat plate phototransparency with a layer of liquid photopolymer,
    registering the phototransparency on the printed wiring board with the two liquid photopolymer layers in air free contact to form a flat photopolymer surface with the transparency,
    exposing the photopolymer layers to radiation through the phototransparency to harden those patterns to be covered by the solder mask coating,
    removing the transparency to produce a smooth flat planar outer glossy surface on those patterns, and
    washing out the unhardened photopolymer to establish exposed land areas.

2. The method of improving reliability of connector sites at land areas on printed wiring boards having conductor layer traces with circuit thereon adhered to an insulation board substrate, comprising the steps of:
    placing an insulation layer of a thickness of at least 0.002 in. (0.005 cm) selectively over part of the traces and leaving exposed land areas of said conductor traces to be metallized and adjacent insulation surface area on the insulation layer adjacent the land areas, and
    metallizing the exposed land areas together with said adjacent insulation surface area wherein the insulation layer is metallized on sidewalls surrounding the exposed land area, thereby increasing the metallized surface area beyond the bounds of the exposed land areas wherein the step of placing the insulation layer selectively over the conductor traces comprises the steps of coating the entire surface of the printed wiring board with a layer of liquid photopolymer, coating a flat plate phototransparency with a layer of liquid photopolymer, registering the photo transparency with the printed wiring board with the two liquid layers in air free contact, exposing the photopolymer to radiation through the photo transparency to harden those areas to be covered by the insulation layer, and washing out the unhardened photopolymer to establish said exposed land areas.

3. The method defined in claim 2 including the step of placing the two liquid layers together in a vacuum of approximately 25 inches (62.5 cm) of mercury to exclude air.

4. The method of printing wiring board manufacture characterised by the steps of placing a solder mask layer directly in contact with wires on a printed wiring board substrate, treating the solder mask layer to produce a flat planar outer solder mask coating surface to which a metallic layer does not permanently adhere, forming a temporary metallic layer on said flat surface of said board with the solder mask coating in place, covering only the flat surface of said metallic coating over the solder mask coating with a protective insulation layer and removing both the protective layer and metallic coating thereunder.

5. The method of manufacturing printed circuit boards comprising the steps of:
    covering conductor traces on a printed circuit board substrate with a solder mask insulating layer having a flat outer surface to leave exposed those areas to be circuit interconnections,
    placing a very thin layer of copper over the solder mask and exposed areas,
    covering the flat solder mask surface with the copper layer thereon thereover with an insulation layer, and
    electroplating additional copper onto the exposed copper circuit connection areas wherein the insulating layer covering the copper layer together with the copper layer are mechanically removed after the electroplating step.

6. The method of improving reliability of connector sites at land areas on printed wiring boards having conductor layer traces with circuit thereon adhered to an insulation board substrate, comprising the steps of:
  placing an insulation layer of a thickness of at least 0.002 in. (0.005 cm) selectively over part of the traces and leaving exposed land areas of said conductor traces to be metallized and adjacent insulation surface area on the insulation layer adjacent the land areas, and
  metallizing the exposed land areas together with said adjacent insulation surface area wherein the insulation layer is metallized on sidewalls surrounding the exposed land area, thereby increasing the metallized surface area beyond the bounds of the exposed land areas wherein the insulation layer placed over the conductor traces comprises a photopolymer with a high gloss outermost surface, further including the steps of metallizing the gloss surface and the exposed land areas with a thin metallic layer by chemical deposition, placing a resist layer over the metallized high gloss surface with the exposed land areas remaining exposed, electroplating a metal onto the metallic layer in the exposed land area using the metallic layer as a conductor therefor to increase the thickness of the metal of the land connector sites, and removing the resist layer and thin metallic layer from the high gloss surface.

* * * * *